(12) United States Patent
Dahms et al.

(10) Patent No.: US 7,877,431 B2
(45) Date of Patent: Jan. 25, 2011

(54) FLOATING POINT ENCODING SYSTEMS AND METHODS

(75) Inventors: John F.A. Dahms, Waterloo (CA); David P. Yach, Waterloo (CA)

(73) Assignee: Research In Motion Limited (CA)

( * ) Notice: Subject to any disclaimer, the term of this patent is extended or adjusted under 35 U.S.C. 154(b) by 1198 days.

(21) Appl. No.: 11/220,821

(22) Filed: Sep. 7, 2005

(65) Prior Publication Data

US 2006/0053191 A1 Mar. 9, 2006

Related U.S. Application Data

(60) Provisional application No. 60/607,772, filed on Sep. 7, 2004.

(51) Int. Cl.
*G06F 7/38* (2006.01)
(52) U.S. Cl. .................................. 708/495; 708/513
(58) Field of Classification Search ............... 708/495, 708/513
See application file for complete search history.

(56) References Cited

U.S. PATENT DOCUMENTS 5,257,214 A 10/1993 Mason et al.
5,602,769 A * 2/1997 Yu et al. ..................... 708/503
5,978,901 A 11/1999 Luedtke et al.
6,138,135 A * 10/2000 Karp ........................... 708/496
6,629,231 B1 * 9/2003 Lohman ........................ 712/1

OTHER PUBLICATIONS

International Search Report of Application No. PCT/CA2005/001364, date of mailing Dec. 8, 2005—11 pgs.
ECMA General Assembly, ECMAScript Language Specification, Standard ECMA-262, 3rd Edition, Dec. 1999, XP002339569.
R. Murray, Floating Point Instruction, Online, Aug. 4, 2004, XP002516048.
Office Action issued by the Canadian Intellectual Property Office on Mar. 22, 2010 for Canadian patent application number 2,544,656.
Communication Pursuant to Article 94(3) EPC issued by the European Patent Office on Aug. 24, 2009 for European patent application number 05779496.8.
Gudeman, David, Representing Type Information in Dynamically Typed Languages, technical report number 93-27, Oct. 1993, Department of Cumputer Science, The University of Arizona, Tucson, Arizona, USA.

* cited by examiner

*Primary Examiner*—Chuong D Ngo
(74) *Attorney, Agent, or Firm*—Jones Day

(57) ABSTRACT

Systems and methods for encoding floating point numbers. A system can include encoding logic which encodes invalid floating point representations as valid data. Decoding logic can be used to recognize the invalid floating point representations and map can provide the invalid floating point representations to valid data values. The decoding logic then can provide the valid data values so that operations on the valid data values can be performed in accordance with instructions received from an associated program.

20 Claims, 10 Drawing Sheets

| SIGN | 11111111111 | 10000000000000000000000000000000000000000000000000000 |
|---|---|---|
| | 210a | 220a — NOT-A-NUMBER (NAN) — 230a |

— 200a

| SIGN | 11111111111 | 10000000000000000000000000000000000000000000000000001 THROUGH 11111111111111111111111111111111111111111111111111111 |
|---|---|---|
| | 210b | 220b — SHIFTED SMALL DE-NORMALIZED NUMBERS — 230b |

— 200b

| 0 | 00000000000 | 00000000000000000000000000000000000000000000000000001 THROUGH 01111111111111111111111111111111111111111111111111111 |
|---|---|---|
| | 210c | 220c — RESERVED FOR TYPED VARIABLES — 230c |

— 200c

| | | 240 | 250 |
|---|---|---|---|
| | | TYPE | VALUE |
| 0 | 00000000000 | 0 XXXXXXXXXXXXXXXXX | 32-BIT DATA VALUE |
| | 210d | 220d — 32-BIT TYPED DATA | — 260 |

— 200d

FLOATING POINT ENCODING SYSTEMS AND METHODS

CROSS-REFERENCE TO RELATED APPLICATION

This application claims priority to and the benefit of U.S. provisional application Ser. No. 60/607,772, filed on Sep. 7, 2004, of which the entire disclosure (including any and all figures) is incorporated herein by reference.

BACKGROUND

1. Technical Field

This disclosure relates to the field of type resolution in programming languages, and in particular to encoding floating point numbers.

2. Description of the Related Art

In interpretive languages like ECMAScript (standardized under the European Computer Manufacturer's Association; see also, ISO standard 16262), numbers are treated the same regardless of the particular attributes of the number. For example, simple integers are treated as double precision floating point numbers. (The double precision floating point standard is described in the Institute of Electrical and Electronic Engineers (IEEE) 754-1985 standard, which is hereby incorporated by reference.) However, certain processing environments (e.g., mobile devices, personal digital assistants, etc.) do not include a floating point processor. These processing environments instead can attempt to emulate a floating point number in the software, which can be slow and inefficient when compared to devices including a floating point processor or even the same device operating upon integers. For example, the operation 2+2 in a software emulation of floating point numbers can be orders of magnitude slower than performing the same operation using integer-typed variables.

BRIEF DESCRIPTION OF THE DRAWINGS

Embodiments are described in detail by way of examples only, with reference to the accompanying drawings, in which.

The same reference numerals are used in different figures to refer to similar elements.

DETAILED DESCRIPTION

Figure 1A:
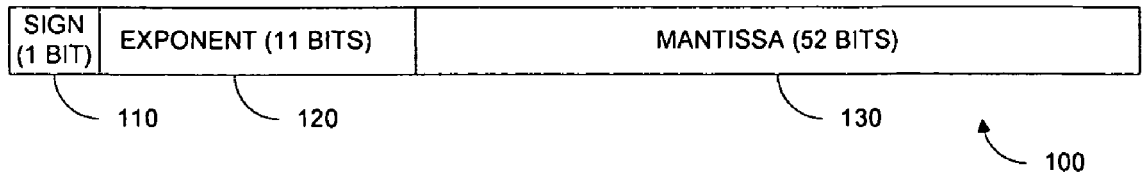
FIGS. 1A and 1B are data structure diagrams illustrating a floating point number under the IEEE 754 standard.
Figure 1B:
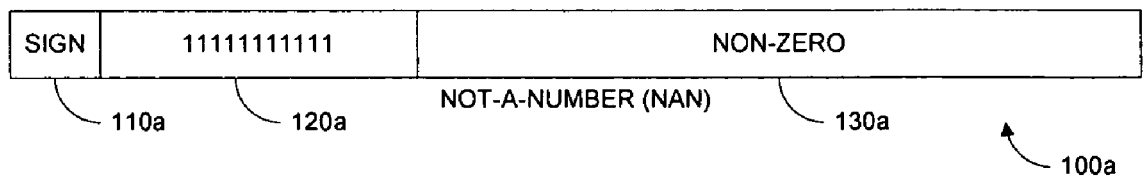
Figure 1B:
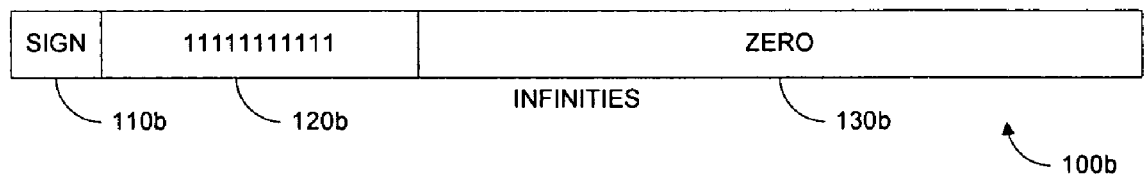
Figure 1B:
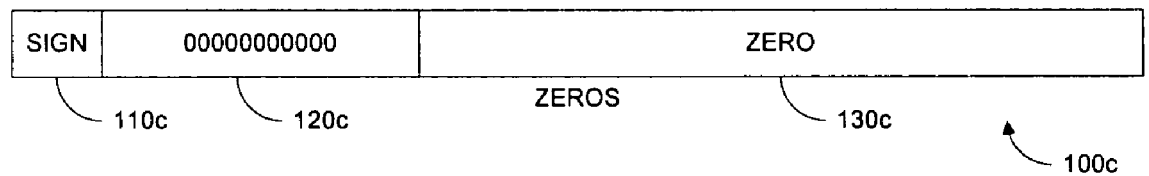
Figure 1B:
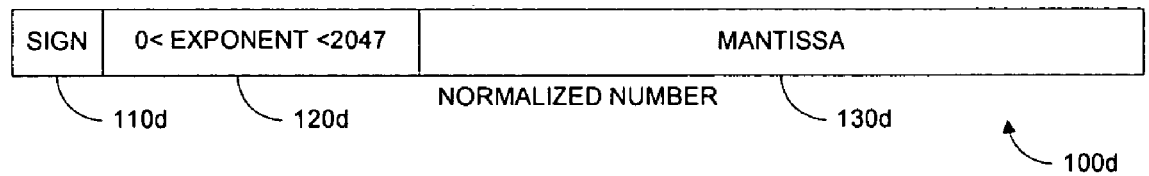
Figure 1B:
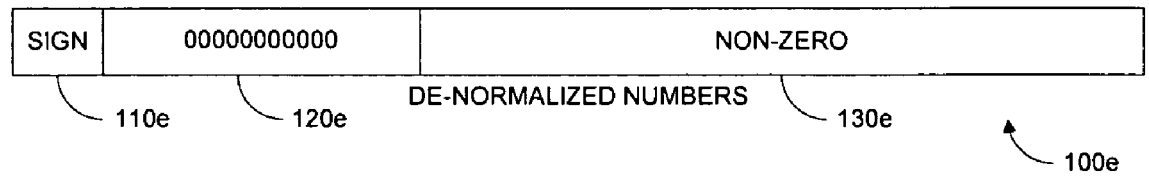

FIGS. 1A and 1B illustrate data structures for use with floating point numbers in accordance with the IEEE 754 standard. This standard may be used by a mobile device that lacks a floating point processor. However, it should be recognized that the present disclosure could be used on any device, including those having a floating point processor as well as being based upon different standards.

With reference to FIG. 1A, a double precision floating point number 100 is shown. The double precision floating point number 100 includes a sign value representation 110, an exponent value representation 120, and a mantissa value representation 130. Because there are two possible values for the sign of a number, positive and negative, the sign value representation 110 is encoded into a single bit. The positive encoding of the sign value representation 110 is "zero" (0), while the negative encoding of the sign value representation 110 is "one" (1). The exponent value representation 120 is an 11 bit binary number. Thus, one can encode exponents up to 2048. However, it should be recognized that a floating point standard can use a biased exponent. Thus, the true exponent in the double precision floating point standard may be the eleven bit exponent minus 1023. The previous assignments leave 52 bits for the mantissa value representation 130.

In this non-limiting example involving this IEEE standard, if one were encoding the number −118.625 using the double precision floating point notation, one would first note the sign of the number. Because the number is negative, the sign value of the double precision floating point number will be "one" (1). Then, the number would be changed to binary notation. It should be recognized that 118.625 converts to 1110110.101 ($1 \times 2^6 + 1 \times 2^5 + 1 \times 2^4 + 1 \times 2^2 + 1 \times 2^1 + 1 \times 2^{-1} + 1 \times 2^{-3}$). The radix point is then shifted to the left, similar to scientific notation leaving $1.110110101 \times 2^6$. Thus, the true exponent for the conversion is 6. However, because the system is biased, 1023 is added to the 6 to produce an 11 digit binary number: 10000000101. Next, the double precision floating point standard recognizes that normalized numbers include a "leading one," thus the first one is dropped. The binary mantissa is then filled out with zeros to accommodate the space given for the double precision floating point number. In this example, the 52-bit mantissa would be:

1101101010000000000000000000000000000000000000000000.

Thus, the complete double precision floating point number is:

1100000001011101101010000000000000000000000000000000000000000000.

With reference to FIG. 1B, examples are shown of five classes of numbers included within the floating point notation. In the examples, these classes include: Not-a-number (NaN) representations 100a; infinity representations (positive and negative) 100b; zero representations (positive and negative) 100c; normalized number representations 100d; and denormalized number representations 100e. The NaN representations 100a include an exponent representation 120a of 2048 (all "ones"), and a non-zero mantissa value representation 130a.

The NaN representations 100a include both positive and negative sign value representation 110a. The infinity representations 100b are similar to the NaN representations 100a, however, the mantissa value representation 130b is zero. Because there exist infinity representations 100a for both positive and negative infinity, the sign value representation 110b can be either a one or a zero, depending upon whether a negative infinity or a positive infinity, respectively, is intended. The zero representations 100c include all zeros in the exponent value representation 120c, and all zeros in the mantissa value representation 130c. Further, there exists the possibility for positive zero or negative zero. As such, the sign value representation 110c can be either zero or one, respectively.

Normalized number representations 100d include exponent values between zero and 2047. It should be recognized that 2048 may not be included, because this exponent value is used for the NaN representations 100a and the infinity representations 100b. The sign value representation 110d and the mantissa value representation 130d are then assigned according to the number being represented (as illustrated in the example above). Again, a leading one is presumed, except in the case where the exponent value representation 120 is zero.

When the exponent value representation 120 is zero, the number is a denormalized number representation 100e. Denormalized number representation 100e has zero as an exponent value representation 120e, and a non-zero binary number represented in the mantissa value representation 130e. However, there is no leading one in the denormalized class of numbers. It should be understood that a leading zero can be used instead. The sign value representation 110e is assigned according to the number being represented. For negative denormal numbers, the sign value representation 110e is a "one" (1), and for positive denormal numbers, the sign value representation 110e is a "zero" (0).

Figure 2A:
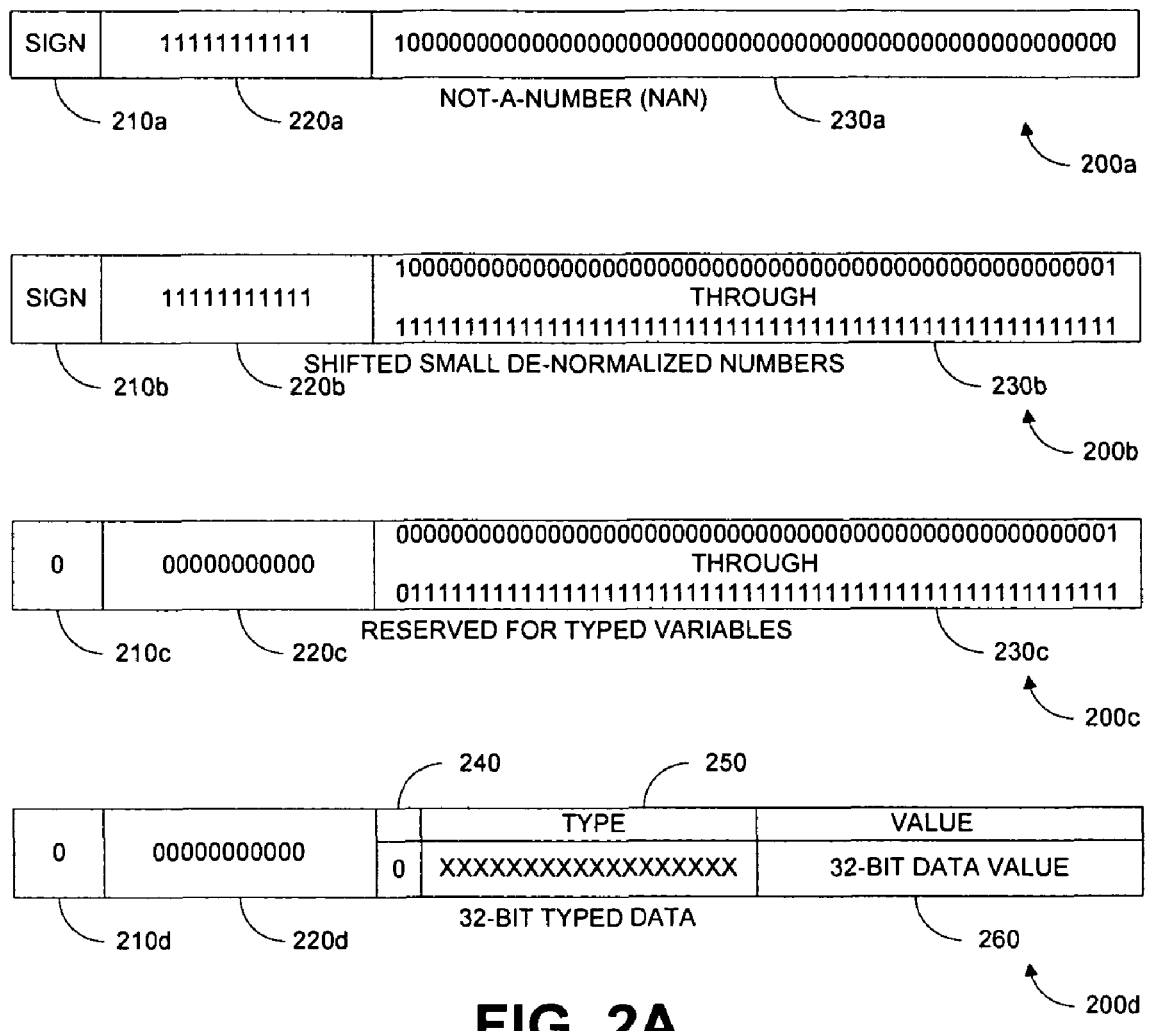
FIG. 2A is a data structure diagram illustrating a floating point encoding scheme.

With reference to FIG. 2A, shown is an alternative data structure according to an embodiment of the present disclosure. In this embodiment, a single NaN value representation 200a is assigned to be the NaN representation for every NaN value. It should be understood that this is possible because every NaN value has the same rules, and technically has no real value. For example, when a NaN value is used in an operation, the result may always be NaN. Moreover, when a NaN value is compared to itself, the result is that the value is not equal to itself. Thus, it does not matter whether there are thousands of NaN values or a single NaN value. As such, a single floating point representation 200a can be used to represent all NaN values.

Such an assignment frees up the NaN number space to be used for an alternative assignment. In an embodiment, among others, of the present disclosure, small denormal number representations 200b are shifted to the NaN space freed up by the assignment of a single NaN value representation 200a. The small denormal numbers which formerly were represented by all zeros in the exponent representation and zero in the most significant bit (MSB) of the mantissa value representation 230b are now shifted to the empty NaN number space where each of bits 63:50 are all "ones" (1). As a result of this shift, the number space with "zeros" (0) in bits 63:50 is empty. The empty space created by shifting the small denormal numbers can then be used for another assignment of the floating point representations.

In one embodiment, among others, of the present disclosure, the vacant small denormal space is used to encode typed data and values associated with the data type. Shown in FIG. 2A is a floating point typed variable representation 200c. In this embodiment, bits 63:50 are all zeros. Thus, a developer can easily and efficiently test for the existence of zeros in the 13 most significant bits to determine whether the number representation 200c is a typed number. If the number is a typed number representation 200c, the 50 least significant bits can be partitioned to provide both a type representation 250 and a value representation 260. The type representation 250 and value representation 260 can include the entire mantissa representation, with the exception of the MSB. The type representation 250, in an embodiment, among others, occupies bits 49:32, while the value representation 260 occupies bits 31:0. Thus a data type can be defined using the double precision floating point standard, with the data set being adequately defined for the user's purpose using only 32 bits (as opposed to the full 64 bits of space provided on the stack in this example).

One should recognize that the approaches described above could provide many ways in which to define a data set, and that the type representation 250 could use more bits or less bits, and the value representation 260 could use more bits or less bits, depending upon the developer's needs and/or a balancing of the number of data types desired and the number of value representations desired in which to encode the data. Furthermore, it should be recognized that a smaller or larger group of denormal numbers could be shifted to the empty NaN space, and that more than one NaN could be defined in accordance with the approaches disclosed herein. Moreover, a system and method could be configured to define typed data within the single precision floating point standard as well. The difference would be that there would be less space within which to define the data types and their associated values. However, the single precision floating point standard can be partitioned in accordance with the principles discussed with respect to the reallocation of double precision floating point standard NaN space.

Figure 2B:
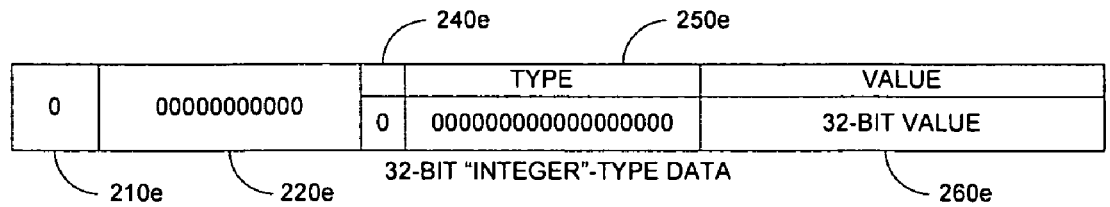
FIGS. 2B-2G are data structure diagrams illustrating use of an encoding scheme to encode different data types.

FIG. 2B shows an example, among others, of integer-typed value representations 200e. In this example, the integer-typed data is represented by all "zeros" (000000000000000000) in the type representation 250e of the integer-typed value representations 200e. In this example, over four billion integer values can be represented using the 32-bit space. Moreover, in alternative embodiments, among others, the negative integers can be represented using the sign value representation 210e. The MSB of the 32-bit value representation 260e could be used as a sign value representation, and bits 0:30 could form the argument operated on by the sign value representation.

Using this structure for the integer-typed data enables the programmer to use efficient commands when performing operations on the data. For example, a program can test for all "zeros" (000000000000000000) in two operands in three machine instructions, and perform an integer operation on the two operands upon determining that each of the operands are integer-type data.

Figure 2C:
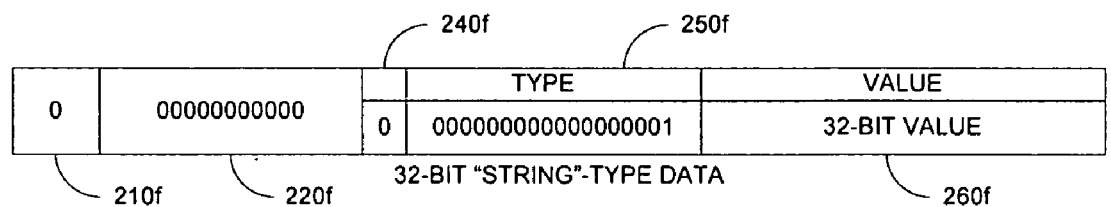

With reference to FIG. 2C, shown is an example, among others, of string-typed value representations 200f. In this example, the string-typed data is represented by one (000000000000000001) in the type representation 250f of the string-typed value representations 200f. Strings up to four American Standard Code for Information Interchange (ASCII) characters in length can be represented using the 32-bit space. Moreover, other smaller character sets may be used in order to encode longer strings of data. Furthermore, as in the C programming language, the data-type could be limited to characters. Thus, character arrays could be used to provide strings containing multiple characters.

Similar to the integer-typed data, the string type enables a developer to use more efficient programming constructs to process the data. For example, if a test determines that the data is string-typed data, string operations can be performed upon the string.

Figure 2D:
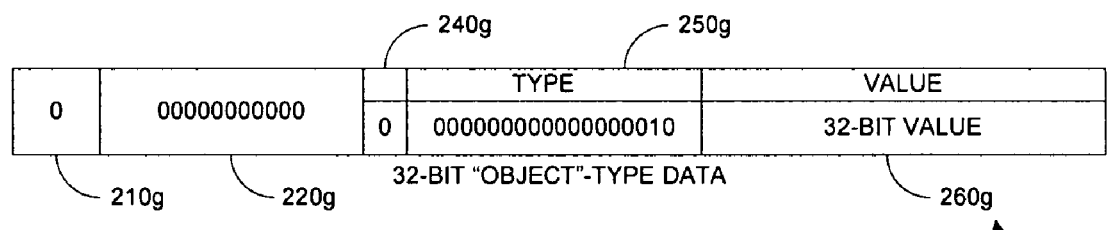

With reference to FIG. 2D, shown is an example, among others, of object-typed value representations 200g. In this example, the object-typed data is represented by a "two" (000000000000000010) in the type representation 250g of the object-typed value representations 200g. In this example, the object type is used to wrap non-object type data to make it "look" like an object for object-oriented programming.

Figure 2E:
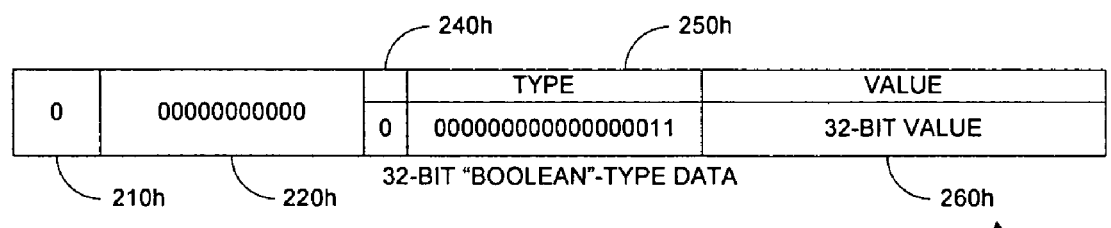

With reference to FIG. 2E, shown is an example, among others, of boolean-typed value representations 200h. In this example, the boolean-typed data is represented by "three" (000000000000000011) in the type representation 250g of the string-typed value representations 200g. The boolean data type can represent either "true" or "false." "False" can be represented by a "zero" (0), while "true" can be represented by a "one" (1), with the more significant bits being zeros.

Figure 2F:
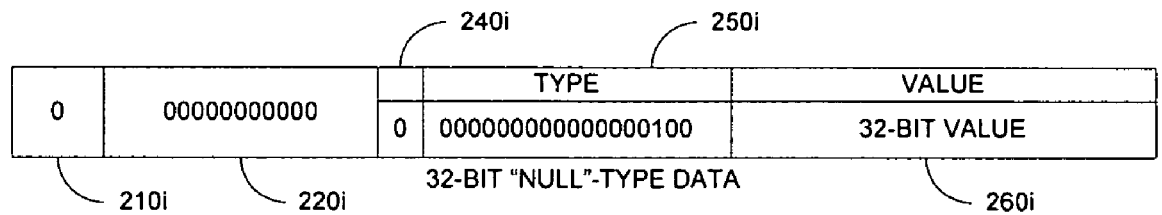

With reference to FIG. 2F, shown is an example, among others, of null-typed value representations 200i. In this example, the null-typed data is represented by "four" (000000000000000100) in the type representation 250i of the null-typed value representations 200i. The null-type is a data type used to indicate that the variable has a null value. The null value is encoded as its own type such that a programmer (or a software program) is able to check for the null value directly, rather than testing for object-type data, and then determine that the pointer is null.

Figure 2G:
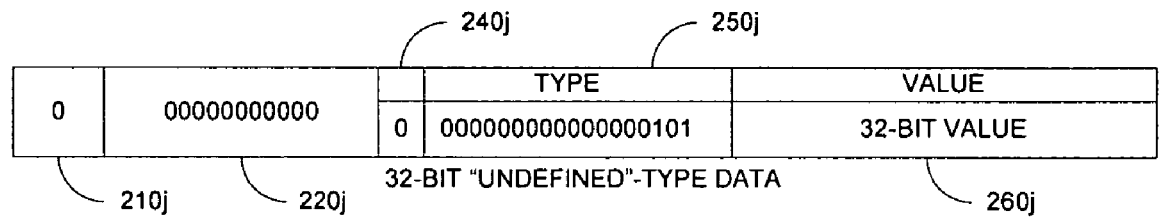

With reference to FIG. 2G, shown is an example, among others, of undefined-typed value representations 200j. In this example, the undefined-typed data is represented by five (000000000000000101) in the type representation 250j of the undefined-typed value representations 200j. The undefined-data type is used to represent a variable which has not been initialized. The uninitialized variable in ECMAScript is defined to have a special value, called "undefined." The "undefined" value is not equal to any of the other possible values of a number, string, boolean, etc.

Figure 3A:
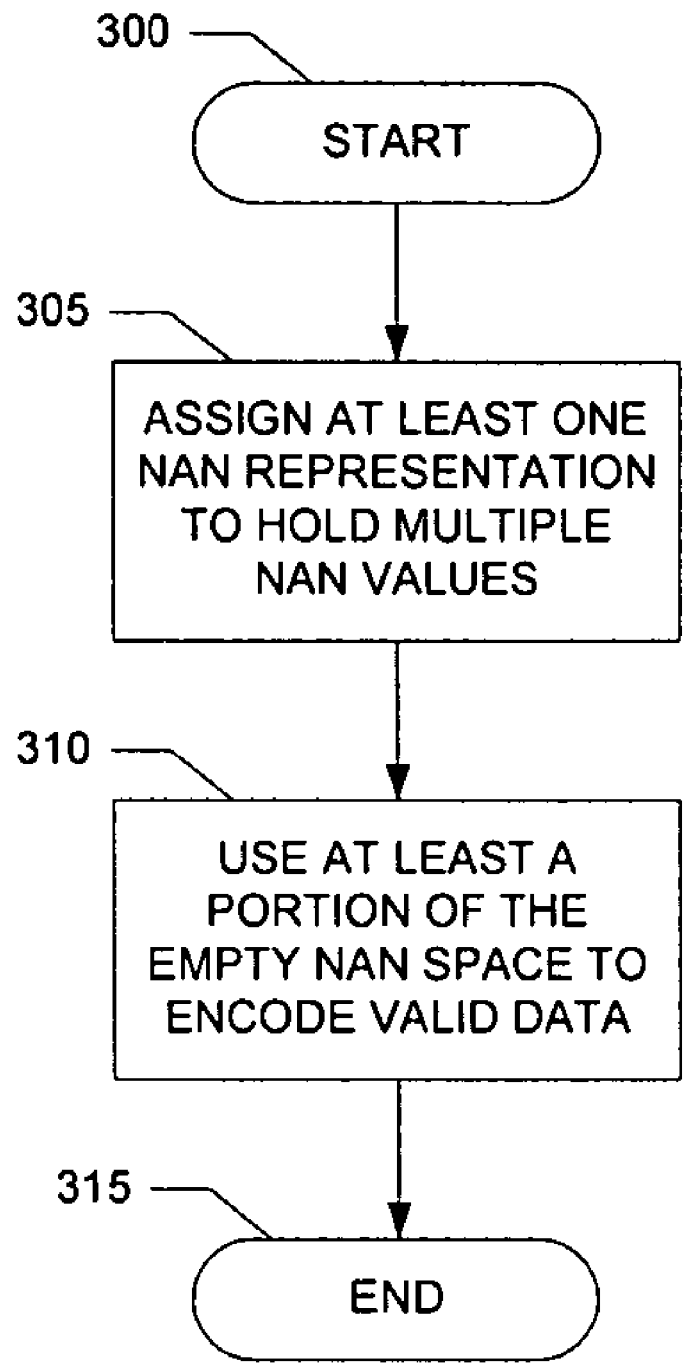
FIGS. 3A-3C are flowcharts illustrating operational scenarios of an encoder.

With reference to FIG. 3A, shown is a flowchart illustrating an operational scenario of an encoder. The operation of an encoder starts in step 300. In step 305, at least one NaN representation 200a is assigned to hold multiple NaN values. This frees up space for at least a portion of the NaN space to be reallocated for other uses. As shown in step 310, the empty NaN space is then used to encode valid data within the former NaN space. The encoder is then finished encoding the floating point number space as shown in step 315. It should be understood that the encoder can perform such operations with encoding logic instructions, which can be implemented in either software or hardware.

Figure 3B:
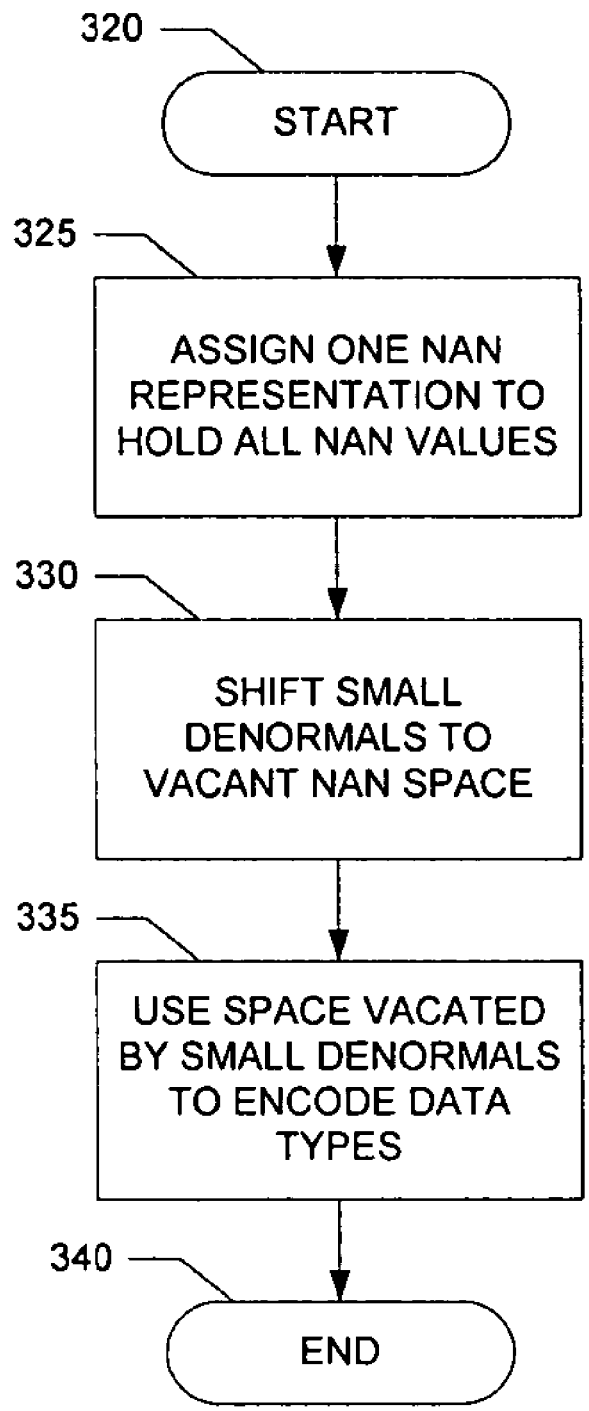

FIG. 3B illustrates an operational scenario wherein an encoder starts in step 320 the process of encoding the floating point number space. The encoder assigns one NaN representation to hold all NaN values, as shown in step 325. In step 330, a set of small denormalized numbers is shifted to the vacant NaN space. The developer may determine how many of these small denormalized numbers should be shifted to the NaN space, as the exact number can depend on design considerations such as the desired number of data types and the desired length of each of those data types. For example, if the developer could get away with providing only a few data types, and a relatively short length for those data types, this would enable the developer to map only a small amount of small denormalized numbers to the vacant NaN space. However, larger numbers of data types and longer length of those data types, in some embodiments, could mean moving the entire denormalized number space into the vacant NaN space. As shown in step 335, the space vacated by the small denormalized numbers is then used to encode data types and values associated with those data types. The encoder is then finished encoding the floating point number space, as shown in step 340.

Figure 3C:
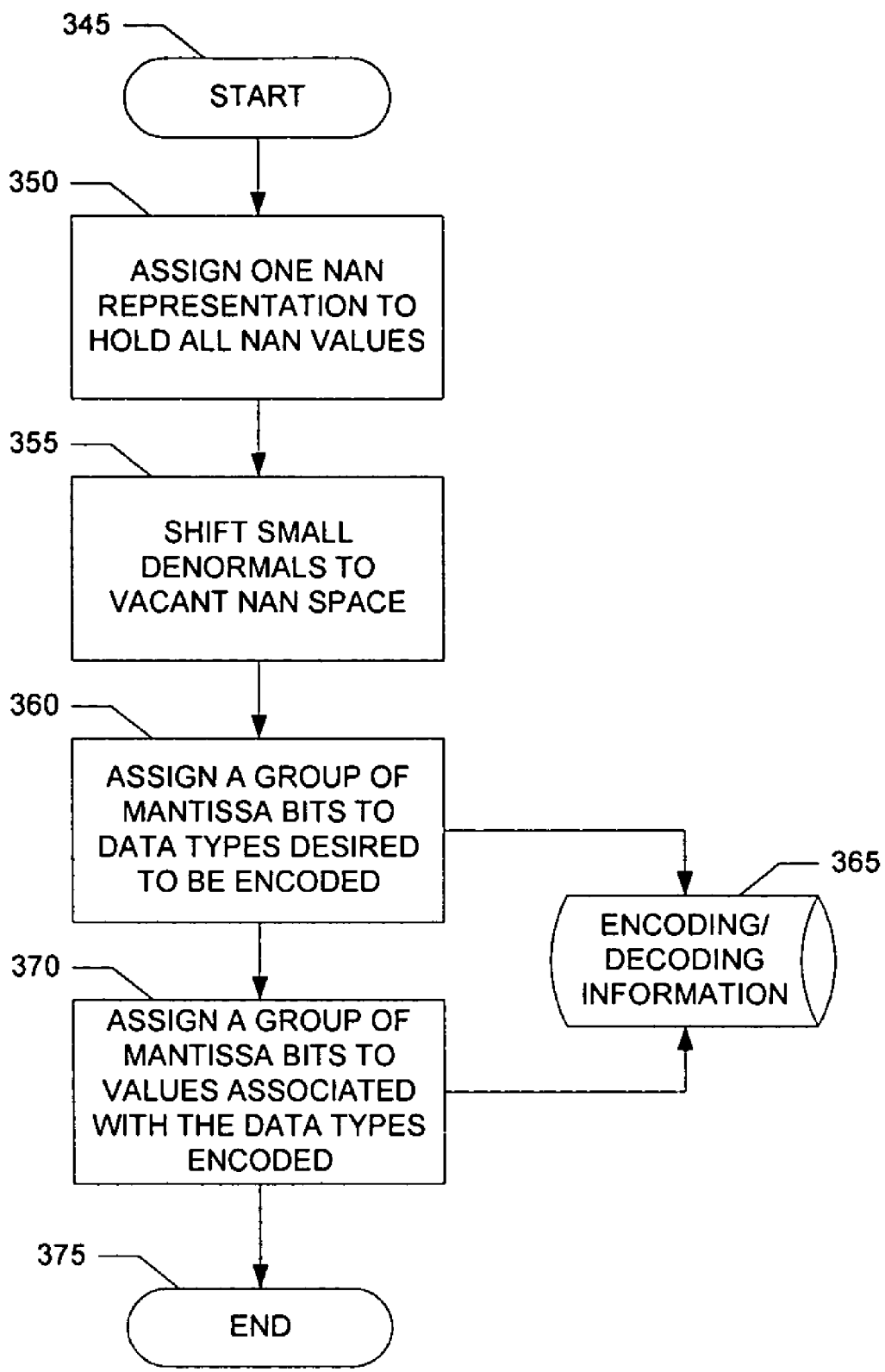

With reference to FIG. 3C, shown is a flowchart illustrating operation of an encoder which assigns at stop 3509 one NaN representation 200a to hold all NaN values. As described above, this can be done because all NaN values have the same characteristics. All of the NaN values produce a NaN value when used in an operation, including those operations where the NaN value is compared to itself.

In step 355, at least a portion of the denormalized numbers (e.g., exponent representation equalling "zero" with a non-zero mantissa representation) is shifted into the space vacated by the assignment of the single NaN representation 200a. However, it should be noted, that in various embodiments of the present disclosure, there may exist more than one NaN representation 200a.

In step 360, the encoder assigns a group of mantissa bits in the vacated small denormal space which define a desired data type. These mantissa bit assignments are stored as encoding/decoding information in storage space 365. In an embodiment, among others, of the present disclosure, the encoder assignments include, among others: an "integer" data type represented by a "zero"; a "string" data type represented by a "one"; an "object" data type represented by a "two"; a "boolean" data type represented by a "three"; a "void" data type represented by a "four"; and, an "undefined" data type represented by a "five." It should be appreciated that these data types are only a small sample of the possible data types which could be encoded in accordance with the approaches disclosed herein. It is intended that all data types which can be encoded in accordance with these approaches be included within the scope of the present disclosure.

Moreover, it should also be recognized that in various embodiments, among others, of the present disclosure, the data types can be assigned to various type values ("one," "two," "three," etc.) without regard to the particular assignment discussed above. However, it should be noted that the assignment of the data types to the various type values may lead to efficiencies in the use of the data types. For example, when the types are grouped densely, it is more efficient than when the types are spaced farther apart.

In step 370, the encoder assigns a value to each of the mantissa representations used in the data type. For example, an integer data type maps the lowest 32 mantissa bits directly, such that one is the integer one. However, it is not necessary to map the mantissa representations directly to the integer space. As an example, in a string, the character "A" can be mapped to zero. However, there is no reason why the character "A" must be mapped to zero. It should be apparent to that there are myriad ways to map the data type space to the 32-bit number space, and that each of these ways are intended to be included within the scope of the present disclosure. The mapping of the data type space to the 32-bit number space is then stored as encoding/decoding information in storage space 365. The encoding process is completed at step 375, though it should be noted that the start and end blocks are not required in any embodiments of the present invention, but are included merely for clarity in these example operational scenarios.

Figure 4A:
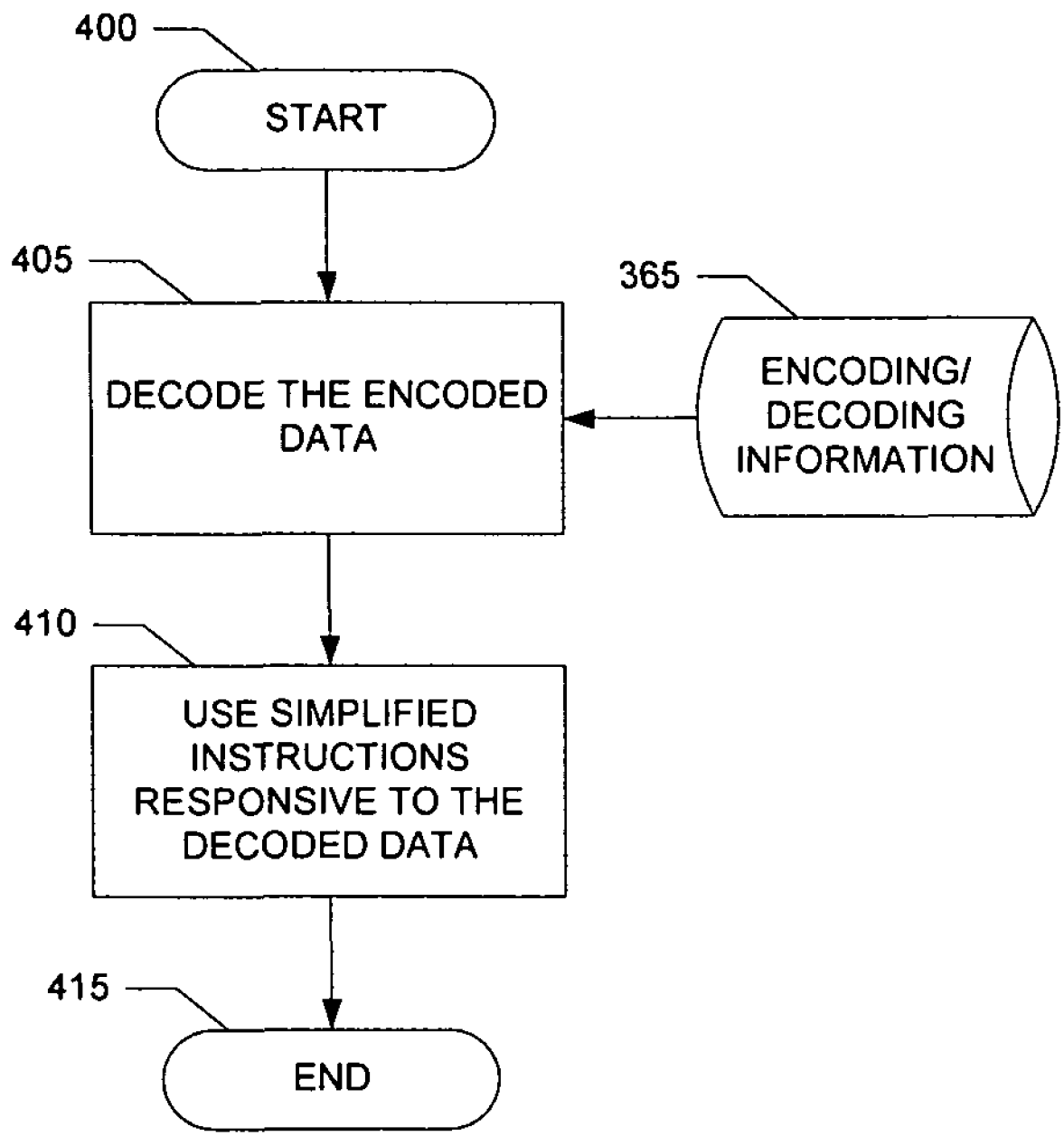
FIGS. 4A and 4B are flowcharts illustrating operational scenarios of a decoder.

FIG. 4A shows a flowchart illustrating the operation of an embodiment, among others, of a decoder/processing system in accordance with the present disclosure. In step 400, decoding logic instructions executed on the decoder/processing system begin the process of decoding a floating point number. The decoder/processing system decodes the encoded data using the encoding/decoding information 365 stored in memory, as shown in step 405. In step 410, the decoder/processing system uses simplified instructions to perform an operation on the decoded data. It should be noted that these simplified instructions may be implicated by the data type of the decoded data. The decoder/processing system is finished with the process in step 515. It should be understood that decoding logic instructions, as used in this disclosure, can be implemented in either software or hardware.

Figure 4B:
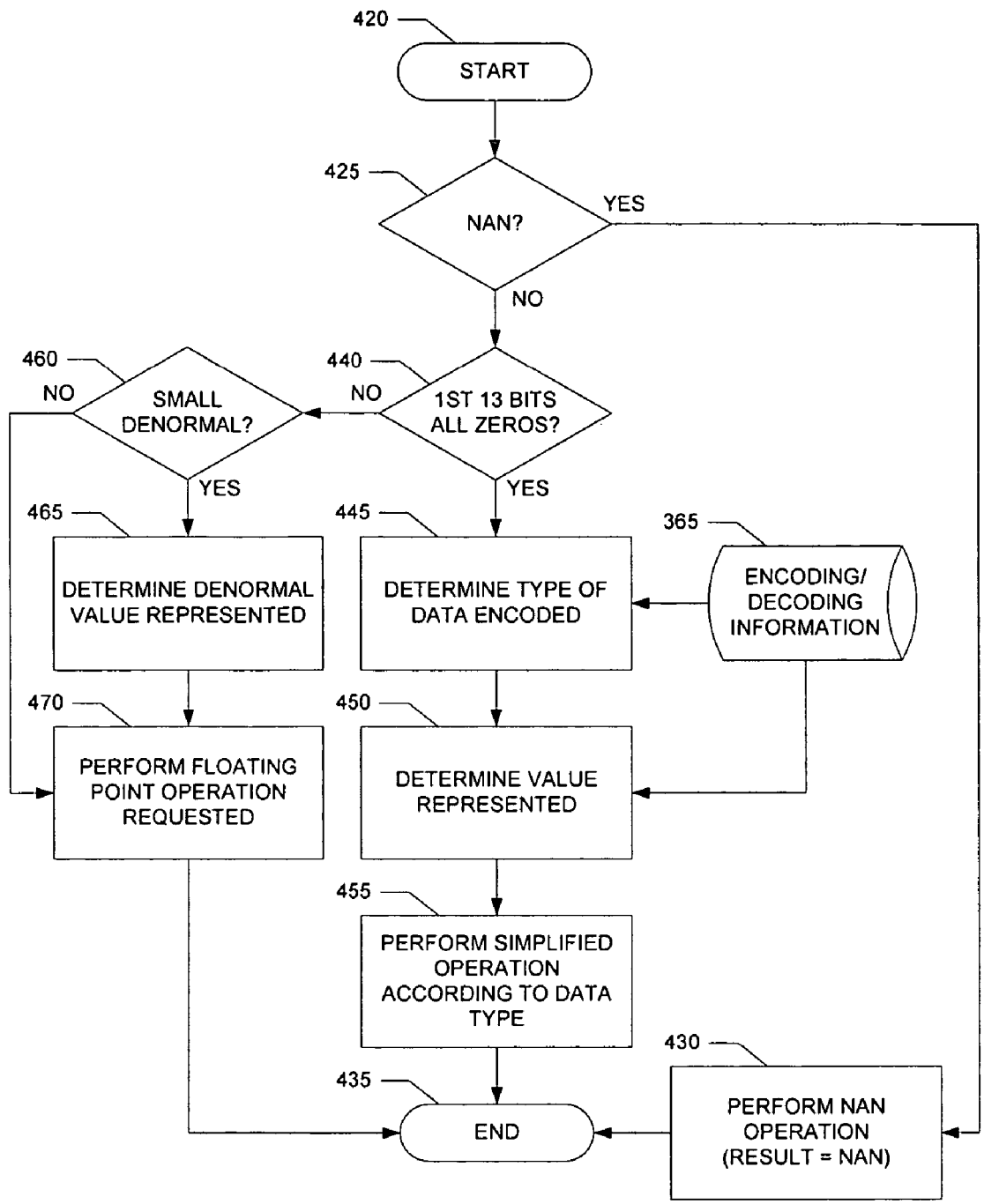

FIG. 4B shows a flowchart illustrating the operation of an embodiment, among others, of a decoder/processing system in accordance with the present disclosure. The decoder/processing system begins decoding the floating point number in step 420. In step 425, the decoder/processing system determines whether the floating point number is a NaN. In an embodiment, among others, of the present disclosure, a single NaN representation is used. Thus, the variable is inspected to determine whether the bits are set in accordance with the definition of the single NaN representation. If the number is a NaN, the decoder/processor performs the operation involving the NaN representation as shown in step 430. In the IEEE floating point standard, the result of any operation including a NaN representation is a NaN representation itself. The decoder/processing system is then finished with the decoding process, as shown in step 435.

If the floating point number is not a NaN representation, in one embodiment, among others, of the present disclosure the decoder/processing system determines whether the 13 most significant bits are all zeros, as shown in step 440. If the sign value representation 210, the exponent value representation 220, and the mantissa MSB 240 are all zeros, the variable contains typed-data. As such, in step 445, the decoder/processing system determines what type of data is contained by examining bits 49:32 and pulling the encoding/decoding information 265 from storage. As explained above, there are numerous types of data, and myriad ways to assign these types to the various type representations 250, each of which is intended to be included within the scope of the present disclosure.

In step 450, the decoder/processing system determines the value represented by the value representation 260. This can be done by retrieving the encoding/decoding information 265 from storage. However, it should be recognized that most languages have a built-in mapping of a binary number to an integer or string responsive to the type of data identified in step 445. As shown in step 450 the decoder/processing system then performs the operation specified by the program using simplified instructions according to the type of data contained by the variable. The decoder/processing system is then finished with the decoding process, as shown in step 435.

If the floating point number does not begin with 13 zeros, the decoder/processing system moves on to step 460, where the decoder/processing system determines whether the floating point number is a small denormal number. As described above, the small denormal numbers were shifted to the space previously used for NaN representations. If the number is a small denormal number, the decoder/processing system determines what denormal value is represented by the floating point number representation, as shown in step 465. The decoder/processing system then performs the floating point operation specified by the program in step 470. The decoder/processing system is then finished with the decoding process, as shown in step 435.

If the floating point number is not a NaN representation, does not begin with 13 zeros, and is not a small denormal number, then the floating point number is an actual floating point number. In this case, the decoder/processing system can operate on the floating point number without decoding the value. Thus, the decoder processing system performs the floating point operation specified by the program in step 470 by using the existing emulator for processing floating point numbers without a floating point processor. The decoder/processing system is then finished with the decoding process, as shown in step 435.

The systems and methods disclosed herein are presented only by way of example and are not meant to limit the scope of the invention. Other variations of the systems and methods described above will be apparent to those skilled in the art and as such are considered to be within the scope of the invention. For example, a system and method can be configured wherein a device that does not include a floating point processor is configured to include decoding logic instructions to recognize invalid floating point representations, and map the invalid floating point representations to valid data values. Processing logic instructions can be used to perform operations on the valid data values.

As another example, a system and method can be configured such that the use of the invalid floating point representations enables a software developer to assign data types to variables. This further enables the software developer to avoid using inefficient floating point emulation to perform relatively simple tasks such as adding integers.

Figure 5:
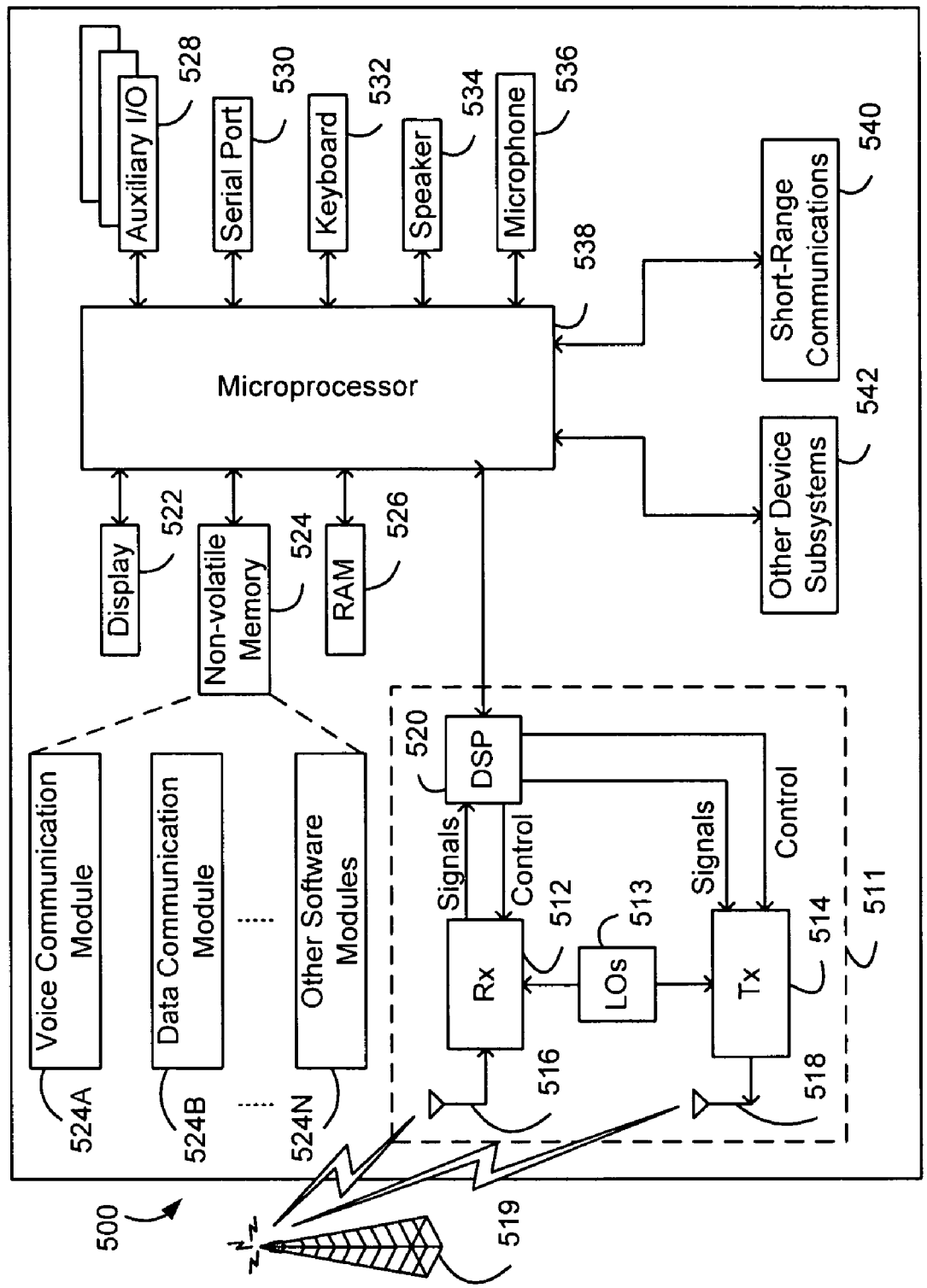
FIG. 5 is a block diagram of an example mobile device which can be used in conjunction with encoders/decoders.

As yet another example, the systems and methods disclosed herein may be used with many different types of computers and devices, such as a wireless mobile communications device shown in FIG. 5. With reference to FIG. 5, the mobile device 130A is a dual-mode mobile device and includes a transceiver 511, a microprocessor 538, a display 522, non-volatile memory 524, random access memory (RAM) 526, one or more auxiliary input/output (I/O) devices 528, a serial port 530, a keyboard 532, a speaker 534, a microphone 536, a short-range wireless communications sub-system 540, and other device sub-systems 542.

The transceiver 511 includes a receiver 512, a transmitter 514, antennas 516 and 518, one or more local oscillators 513, and a digital signal processor (DSP) 520. The antennas 516 and 518 may be antenna elements of a multiple-element antenna, and are preferably embedded antennas. However, the systems and methods described herein are in no way restricted to a particular type of antenna, or even to wireless communication devices.

The mobile device 100 is preferably a two-way communication device having voice and data communication capabilities. Thus, for example, the mobile device 100 may communicate over a voice network, such as any of the analog or digital cellular networks, and may also communicate over a data network. The voice and data networks are depicted in FIG. 5 by the communication tower 519. These voice and data networks may be separate communication networks using separate infrastructure, such as base stations, network controllers, etc., or they may be integrated into a single wireless network.

The transceiver 511 is used to communicate with the network 519, and includes the receiver 512, the transmitter 514, the one or more local oscillators 513 and the DSP 520. The DSP 520 is used to send and receive signals to and from the transceivers 516 and 518, and also provides control information to the receiver 512 and the transmitter 514. If the voice and data communications occur at a single frequency, or closely-spaced sets of frequencies, then a single local oscillator 513 may be used in conjunction with the receiver 512 and the transmitter 514. Alternatively, if different frequencies are utilized for voice communications versus data communications for example, then a plurality of local oscillators 513 can be used to generate a plurality of frequencies corresponding to the voice and data networks 519. Information, which includes both voice and data information, is communicated to and from the transceiver 511 via a link between the DSP 520 and the microprocessor 538.

The detailed design of the transceiver 511, such as frequency band, component selection, power level, etc., will be dependent upon the communication network 519 in which the mobile device 100 is intended to operate. For example, a mobile device 100 intended to operate in a North American market may include a transceiver 511 designed to operate with any of a variety of voice communication networks, such as the Mobitex or DataTAC mobile data communication networks, AMPS, TDMA, CDMA, PCS, etc., whereas a mobile device 100 intended for use in Europe may be configured to operate with the GPRS data communication network and the GSM voice communication network. Other types of data and voice networks, both separate and integrated, may also be utilized with a mobile device 100.

Depending upon the type of network or networks 519, the access requirements for the mobile device 100 may also vary. For example, in the Mobitex and DataTAC data networks, mobile devices are registered on the network using a unique identification number associated with each mobile device. In GPRS data networks, however, network access is associated with a subscriber or user of a mobile device. A GPRS device typically requires a subscriber identity module ("SIM"), which is required in order to operate a mobile device on a GPRS network. Local or non-network communication functions (if any) may be operable, without the SIM device, but a mobile device will be unable to carry out any functions involving communications over the data network 519, other than any legally required operations, such as '911' emergency calling.

After any required network registration or activation procedures have been completed, the mobile device 100 may then send and receive communication signals, including both voice and data signals, over the networks 519. Signals received by the antenna 516 from the communication network 519 are routed to the receiver 512, which provides for signal amplification, frequency down conversion, filtering, channel selection, etc., and may also provide analog to digital conversion. Analog to digital conversion of the received signal allows more complex communication functions, such as digital demodulation and decoding to be performed using the DSP 520. In a similar manner, signals to be transmitted to the network 519 are processed, including modulation and encoding, for example, by the DSP 520 and are then provided to the transmitter 514 for digital to analog conversion, frequency up conversion, filtering, amplification and transmission to the communication network 519 via the antenna 518.

In addition to processing the communication signals, the DSP 520 also provides for transceiver control. For example, the gain levels applied to communication signals in the receiver 512 and the transmitter 514 may be adaptively controlled through automatic gain control algorithms implemented in the DSP 520. Other transceiver control algorithms could also be implemented in the DSP 520 in order to provide more sophisticated control of the transceiver 511.

The microprocessor 538 preferably manages and controls the overall operation of the mobile device 100. Many types of microprocessors or microcontrollers could be used here, or, alternatively, a single DSP 520 could be used to carry out the functions of the microprocessor 538. Low-level communication functions, including at least data and voice communications, are performed through the DSP 520 in the transceiver 511. Other, high-level communication applications, such as a voice communication application 524A, and a data communication application 524B may be stored in the non-volatile memory 524 for execution by the microprocessor 538. For example, the voice communication module 524A may provide a high-level user interface operable to transmit and receive voice calls between the mobile device 100 and a plurality of other voice or dual-mode devices via the network 519. Similarly, the data communication module 524B may provide a high-level user interface operable for sending and receiving data, such as e-mail messages, files, organizer information, short text messages, etc., between the mobile device 100 and a plurality of other data devices via the networks 519. The microprocessor 538 also interacts with other device subsystems, such as the display 522, the RAM 526, the auxiliary input/output (I/O) subsystems 528, the serial port 530, the keyboard 532, the speaker 534, the microphone 536, the short-range communications subsystem 540 and any other device subsystems generally designated as 542.

Some of the subsystems shown in FIG. 5 perform communication-related functions, whereas other subsystems may provide "resident" or on-device functions. Notably, some subsystems, such as the keyboard 532 and the display 522 may be used for both communication-related functions, such as entering a text message for transmission over a data communication network, and device-resident functions such as a calculator or task list or other PDA type functions.

Operating system software used by the microprocessor 538 is preferably stored in a persistent store such as non-volatile memory 524. The non-volatile memory 524 may be implemented, for example, as a Flash memory component, or as battery backed-up RAM. In addition to the operating system, which controls low-level functions of the mobile device 510, the non-volatile memory 524 includes a plurality of software modules 524A-524N that can be executed by the microprocessor 538 (and/or the DSP 520), including a voice communication module 524A, a data communication module 524B, and a plurality of other operational modules 524N for carrying out a plurality of other functions. These modules are executed by the microprocessor 538 and provide a high-level interface between a user and the mobile device 100. This interface typically includes a graphical component provided through the display 522, and an input/output component provided through the auxiliary I/O 528, keyboard 532, speaker 534, and microphone 536. The operating system, specific device applications or modules, or parts thereof, may be temporarily loaded into a volatile store, such as RAM 526 for faster operation. Moreover, received communication signals may also be temporarily stored to RAM 526, before permanently writing them to a file system located in a persistent store such as the Flash memory 524.

An exemplary application module 524N that may be loaded onto the mobile device 100 is a personal information manager (PIM) application providing PDA functionality, such as calendar events, appointments, and task items. This module 524N may also interact with the voice communication module 524A for managing phone calls, voice mails, etc., and may also interact with the data communication module for managing e-mail communications and other data transmissions. Alternatively, all of the functionality of the voice communication module 524A and the data communication module 524B may be integrated into the PIM module.

The non-volatile memory 524 preferably also provides a file system to facilitate storage of PIM data items on the device. The PIM application preferably includes the ability to send and receive data items, either by itself, or in conjunction with the voice and data communication modules 524A, 524B, via the wireless networks 519. The PIM data items are preferably seamlessly integrated, synchronized and updated, via the wireless networks 519, with a corresponding set of data items stored or associated with a host computer system, thereby creating a mirrored system for data items associated with a particular user.

Context objects representing at least partially decoded data items, as well as fully decoded data items, are preferably stored on the mobile device 100 in a volatile and non-persistent store such as the RAM 526. Such information may instead be stored in the non-volatile memory 524, for example, when storage intervals are relatively short, such that the information is removed from memory soon after it is stored. However, storage of this information in the RAM 526 or another volatile and non-persistent store is preferred, in order to ensure that the information is erased from memory when the mobile device 100 loses power. This prevents an unauthorized party from obtaining any stored decoded or partially decoded information by removing a memory chip from the mobile device 100, for example.

The mobile device 100 may be manually synchronized with a host system by placing the device 100 in an interface cradle, which couples the serial port 530 of the mobile device 100 to the serial port of a computer system or device. The serial port 530 may also be used to enable a user to set preferences through an external device or software application, or to download other application modules 524N for installation. This wired download path may be used to load an encryption key onto the device, which is a more secure method than exchanging encryption information via the wireless network 519. Interfaces for other wired download paths may be provided in the mobile device 100, in addition to or instead of the serial port 530. For example, a USB port would provide an interface to a similarly equipped personal computer.

Additional application modules 524N may be loaded onto the mobile device 100 through the networks 519, through an auxiliary I/O subsystem 528, through the serial port 530, through the short-range communications subsystem 540, or through any other suitable subsystem 542, and installed by a user in the non-volatile memory 524 or RAM 526. Such flexibility in application installation increases the functionality of the mobile device 100 and may provide enhanced on-device functions, communication-related functions, or both. For example, secure communication applications may enable electronic commerce functions and other such financial transactions to be performed using the mobile device 100.

When the mobile device 100 is operating in a data communication mode, a received signal, such as a text message or a web page download, is processed by the transceiver module 511 and provided to the microprocessor 538, which preferably further processes the received signal in multiple stages as described above, for eventual output to the display 522, or, alternatively, to an auxiliary I/O device 528. A user of mobile device 100 may also compose data items, such as e-mail messages, using the keyboard 532, which is preferably a complete alphanumeric keyboard laid out in the QWERTY style, although other styles of complete alphanumeric keyboards such as the known DVORAK style may also be used. User input to the mobile device 100 is further enhanced with a plurality of auxiliary I/O devices 528, which may include a thumbwheel input device, a touchpad, a variety of switches, a rocker input switch, etc. The composed data items input by the user may then be transmitted over the communication networks 519 via the transceiver module 511.

When the mobile device 100 is operating in a voice communication mode, the overall operation of the mobile device is substantially similar to the data mode, except that received signals are preferably be output to the speaker 534 and voice signals for transmission are generated by a microphone 536. Alternative voice or audio I/O subsystems, such as a voice message recording subsystem, may also be implemented on the mobile device 100. Although voice or audio signal output is preferably accomplished primarily through the speaker 534, the display 522 may also be used to provide an indication of the identity of a calling party, the duration of a voice call, or other voice call related information. For example, the microprocessor 538, in conjunction with the voice communication module and the operating system software, may detect the caller identification information of an incoming voice call and display it on the display 522.

A short-range communications subsystem 540 is also included in the mobile device 100. The subsystem 540 may include an infrared device and associated circuits and components, or a short-range RF communication module such as a Bluetooth™ module or an 802.11 module, for example, to provide for communication with similarly-enabled systems and devices. It should be appreciated that "Bluetooth" and "802.11" refer to sets of specifications, available from the Institute of Electrical and Electronics Engineers, relating to wireless personal area networks and wireless local area networks, respectively.

The systems and methods may be provided on many different types of computer-readable media including computer storage mechanisms (e.g., CD-ROM, diskette, RAM, flash memory, computer's hard drive, etc.) that contain instructions for use in execution by a processor to perform the methods' operations and implement the systems described herein.

The computer components, software modules, functions and data structures described herein may be connected directly or indirectly to each other in order to allow the flow of data needed for their operations. It is also noted that a module includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code.

To illustrate the broad scope of the systems and methods, the following is provided. Program code is usually interpreted by software. However, a code processor can be implemented in hardware. Adaptation of the system and method to a hardware processor is within the scope of the invention. As additional examples of the wide scope of the systems and methods, a system and method can be configured to enable a software developer to use typed data in a dynamically typed language. Moreover, the system and method may allow for the use of more efficient computations responsive to the typed data, thereby eliminating the use of a floating point emulator in situations where the data does not require the precision of a floating point calculation. The system and method also allow for the use of a standard sized bit stack, for instance, by enabling the user to encode typed data within the bit space allocated for floating point numbers. Further, a system and method can be provided as disclosed herein for reallocation of superfluous values contained within the floating point standard, thereby using the floating point space more efficiently.

It is claimed:

1. A floating point encoding system for a dynamically typed language, the system comprising:
    a data processor;
    encoding logic instructions stored on a computer-readable memory and configured to execute on the data processor and to encode floating point representations in a plurality of empty invalid number spaces created by assigning an invalid floating point representation to hold a plurality of invalid floating point representations, wherein the plurality of invalid floating point representations are defined as not-a-number values;
    decoding logic instructions stored on a computer-readable memory and configured to execute on the data processor and to recognize the plurality of invalid number spaces, and map the plurality of invalid number spaces to a plurality of valid data values, and provide the plurality of valid data values to processing logic instructions so that the plurality of valid data values may be processed.

2. The system of claim 1, wherein a plurality of denormalized numbers are shifted from a denormalized number space to the plurality of invalid number spaces.

3. The system of claim 2, wherein a data type other than floating point numbers is encoded in at least a portion of the denormalized number space.

4. The system of claim 1, wherein the encoding logic instructions are operable to recognize a single invalid floating point representation as reserved for all invalid floating point values associated with the plurality invalid floating point representations.

5. The system of claim 1, wherein the plurality of invalid floating point representations are defined as not-a-number values according to a predetermined floating point standard.

6. The system of claim 1, wherein the plurality of valid data values is of a data type other than a floating point data type, and the processing logic instructions are operable to perform operations on the value and type of data.

7. The system of claim 6, wherein said data type other than floating point data type is selected from the group consisting of a data type integer, string, object, undefined, null, or boolean.

8. A method of encoding data types within a floating point representation used by a processor-based device, the method comprising the steps of:
compressing, by using a data processor, an invalid number space of the floating point representation to create an empty invalid number space, wherein the compressing step includes assigning an invalid number representation to hold multiple invalid number values; wherein the invalid number values of the floating point representation are defined as not-a-number values;
encoding, by using the data processor, a valid number representation in the empty invalid number space created by the compressing step, wherein said valid number representation is decoded and an operation is performed on said valid number representation.

9. The method of claim 8, wherein the compressing step comprises assigning one invalid number representation to hold all invalid number values defined by the floating point standard.

10. The method of claim 8, wherein the encoding step comprises:
shifting at least a portion of a denormal number space into at least a portion of the empty invalid number space and creating an empty denormal space;
encoding a data type and a data value into the empty denormal space.

11. The method of claim 10, wherein said data type is selected from the group consisting of an integer type, a string type, an object type, a boolean type, a null type, or an undefined type.

12. The method of claim 8, wherein the floating point representation is a double precision floating point representation.

13. The method of claim 8, further comprising:
decoding said valid number representation to determine a data type and a value associated with the data type; and
performing an operation on said valid number representation responsive to a data type associated with the operation.

14. Computer software stored on one or more computer readable media, the computer software comprising program code for carrying out a method according to claim 8.

15. A processing system operable to execute a dynamic-typed resolution programming language, the system comprising:
a data processor;
logic instructions stored on a computer-readable memory and configured to execute on the data processor and to store a floating point data structure, the floating point data structure having at least a portion of an invalid data space encoded to include valid data wherein the invalid data space is created by assigning an invalid number representation to hold multiple invalid number representations, wherein the invalid number representations are defined as not-a-number values;
encoding logic instructions stored on a computer-readable memory and configured to execute on the data processor and to encode typed data into the floating point data structure for storage by the memory logic instructions;
decoding logic instructions stored on a computer-readable memory and configured to execute on the data processor and to decode the floating point data structure stored in the memory logic to produce the typed data; and
processing logic instructions stored on a computer-readable memory and configured to execute on the data processor and to instruct the encoding logic instructions to encode a floating point data structure and to instruct the memory logic instructions to store the floating point data structure, the processing logic instructions being further operable to retrieve the floating point data structure from memory, instruct the decoding logic instructions to decode the floating point, and to perform operation on the typed data values.

16. The processing system of claim 15, wherein the encoding logic instructions are operable to assign a plurality of multiple invalid data values to a single invalid data representation, creating an empty invalid data space, and use the empty invalid data space to encode valid data.

17. The processing system of claim 16, wherein the encoding logic instructions are further operable to shift at least a portion of a number set to the empty invalid data space to create an empty valid data space, the encoding logic instructions being further operable to use the empty valid data space to encode typed data within the floating point data structure.

18. The processing system of claim 17, wherein the floating point data structure enables typed data to fit into the same stack as regular floating point data without modification.

19. One or more computer readable media having software program code for processing a floating point number in a programming language having dynamic typed resolution, the software program code comprising:
compression logic operable to compress an invalid number space associated with a floating point representation, the compression creating an empty invalid number space; wherein the compression logic includes assigning an invalid number representation to hold multiple invalid number values; wherein the invalid number values of the floating point representation are defined as not-a-number values;
encoding logic operable to shift a set of valid numbers within the empty invalid number space, creating an empty valid number space, the encoding logic being further operable to encode a set of typed data within the empty valid number space, thereby providing greater flexibility to a programmer.

20. The one or more computer readable media of claim 19, further comprising:
decoding logic operable to decode the set of valid numbers and the set of typed data;
processing logic operable to process the set of typed data values responsive to a type associated with the set of typed data, the processing logic being further operable to process the set of valid numbers, and invalid numbers associated with the compressed invalid number space.

* * * * *